US006468401B1

(12) United States Patent
Yoshikawa et al.

(10) Patent No.: US 6,468,401 B1
(45) Date of Patent: Oct. 22, 2002

(54) FORMATION OF METAL COMPOUND THIN FILM AND PREPARATION OF RUBBER COMPOSITE MATERIAL

(75) Inventors: Masato Yoshikawa, Kodaira; EngKean Sim, Tanashi; Hideo Sugiyama, Higashimurayama; Yukihiro Kusano, Kokubunji; Kazuo Naito, Kawasaki, all of (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 08/634,792

(22) Filed: Apr. 19, 1996

(30) Foreign Application Priority Data

Apr. 24, 1995 (JP) .............................. 7-123164
Apr. 24, 1995 (JP) .............................. 7-123166

(51) Int. Cl.$^7$ .............................................. C23C 14/34
(52) U.S. Cl. ........................... 204/192.15; 204/192.12; 204/192.13; 204/192.16
(58) Field of Search .................. 204/192.1, 192.12, 204/192.13, 192.15, 192.16, 192.17; 427/385.5, 388.1, 419.5

(56) References Cited

U.S. PATENT DOCUMENTS 4,407,709 A * 10/1983 Enjouji et al. ......... 204/192.13
4,883,574 A * 11/1989 Dos Santos Pereina Ribeiro .................................................. 204/192.17
5,108,569 A * 4/1992 Gilboa et al. .......... 204/192.17
5,292,417 A * 3/1994 Kugler .................. 204/192.13

FOREIGN PATENT DOCUMENTS

JP            3-220241      *  9/1991

* cited by examiner

*Primary Examiner*—Rodney G. McDonald
(74) *Attorney, Agent, or Firm*—Sughrue Mion, PLLC

(57) ABSTRACT

A thin film of a metal compound such as metal oxide, nitride and carbide is formed on a substrate by sputtering a target in vacuum in the presence of an inert gas and a reactive gas. From a curve of an input power supplied from a DC supply to the target versus an input voltage between the target and the substrate, a transition point of input power at which an abrupt change of the input voltage occurs is determined. The input power during sputtering is controlled using the transition point as a reference, thereby controlling the composition or physical properties of the thin film. When a cobalt oxide thin film is formed on a substrate in this way, rubber can be vulcanized thereto to form a firm bond.

2 Claims, 1 Drawing Sheet

FORMATION OF METAL COMPOUND THIN FILM AND PREPARATION OF RUBBER COMPOSITE MATERIAL

BACKGROUND OF THE INVENTION

1. Field of the Invention

This invention relates to the formation of metal compound thin films by sputtering and more particularly, to means for effectively controlling the degree of oxidation, nitrogenation or carbonization of metal compounds in forming metal compound thin films by sputtering. It also relates to a method for preparing a rubber composite material having an improved bond between a substrate and a rubber layer.

2. Prior Art

Films of metal compounds are often formed by vacuum evaporation, ion plating and sputtering processes. The vacuum evaporation process is most common. Since a metal compound source is evaporated to deposit a film having the same composition as the source, it is impossible to control the degree of oxidation, nitrogenation or carbonization of the deposited film. The ion plating process involves mixing a rare gas during evaporation to ionize the source material prior to deposition of a film. By varying the ratio of ionizing rare gas to reactant gas, the degree of oxidation of the deposited film can be controlled, but to a limited extent. In order that the degree of oxidation be controlled over a wider range, the rate of deposition and other parameters should also be varied. Among the sputtering process, a high-frequency magnetron sputtering process is suitable for forming films of metal compounds. As in the ion plating, the ratio of rare gas to reactant gas for oxidation or the like must be varied in order to control the degree of oxidation. The degree of oxidation is controlled only in a narrow range and the rate of deposition is extremely slow. Also known is a reactive magnetron sputtering process wherein DC magnetron sputtering is carried out at a selected ratio of rare gas to reactant gas to control the degree of oxidation or the like. It is difficult to deposit films of metal oxide in a reproducible manner by merely controlling the gas ratio. The degree of oxidation can also be controlled by resorting to emission spectroscopy during film deposition although this process lacks reproducibility.

In the field of forming metal compound thin films by sputtering or the like, it is desired to have an efficient simple method capable of controlling the degree of oxidation, nitrogenation or carbonization of deposited films in a reproducible manner.

Metal-rubber composite materials as typified by vibration damping rubber are widely used in the art. A firm bond between metal and rubber is crucial.

Japanese Patent Application Kokai (JP-A) Nos. 87311/1987 and 246278/1987 by the same assignee as the present invention disclose a method for preparing a composite material comprising the steps of dry plating cobalt or cobalt alloy onto a substrate, applying unvulcanized rubber thereon, and vulcanizing the rubber to the substrate whereupon the rubber is firmly bonded to the substrate.

Also in JP-A 290342/1989, a cobalt coating is heat treated during or after deposition to oxidize the cobalt for the purpose of improving the durability (or resistance to wet heat deterioration) of a substrate/rubber composite. More particularly, for the purpose of improving wet heat resistance, reactive sputtering is carried out in argon gas in admixture with oxygen gas to form a cobalt oxide film. However, this method alone achieves insufficient oxidation, failing to fully improve resistance to wet heat deterioration. Resistance to wet heat deterioration can be improved by carrying out heat treatment after film formation to further oxidize the cobalt. Then two steps are necessary. This method failed to achieve a satisfactory bond in a follow-up test where reactive sputtering was carried out in another apparatus. It was thus difficult to carry out this method on a greater scale sufficient for commercial application.

SUMMARY OF THE INVENTION

A primary object of the invention is to provide a method for forming a thin film of metal compound, which ensures simple and reproducible control of the composition (such as a degree of oxidation) and physical properties of the film.

Another object of the invention is to provide a method for preparing a rubber composite material wherein rubber is bonded to a substrate through a cobalt oxide thin film, which method increases and controls the degree of oxidation of the cobalt oxide thin film in a simple manner so that the rubber is firmly bonded to the substrate and which method is applicable on a commercial scale.

Our discovery was derived from an experiment of forming a thin film of a metal compound on a surface of a substrate by sputtering, especially magnetron sputtering. A target of a corresponding metal or metal compound was placed in vacuum and in an atmosphere containing an inert gas and a reactive gas capable of reacting with atoms sputtered from the target to form the metal compound. The reactive gas was a gas having molecular oxygen when the metal compound is a metal oxide, a gas having molecular nitrogen when the metal compound is a metal nitride, and a gas having molecular carbon when the metal compound is a metal carbide. The inert gas and the reactive gas were mixed in a predetermined ratio. An input power was supplied to the target and an input voltage applied between the target and the substrate from a DC supply. The target was thus sputtered in the atmosphere at a predetermined vacuum. The input power and the input voltage were plotted on a graph. An abrupt change of the input voltage occurred at a certain input power. This input power is called a transition point. Quite unexpectedly, films of different performance, that is, having different compositions or physical properties were obtained depending on whether the input power with which sputtering was carried out was above or below the transition point. By adjusting a shift of input power from the transition point, a thin film of metal compound having a controlled composition (such as a controlled degree of oxidation) or controlled physical properties could be formed in a well reproducible manner.

We have also found an effective control means in the process of preparing a rubber composite material by forming a thin film of cobalt oxide on a surface of a substrate, forming a rubber coating on the thin film, and vulcanizing the rubber coating. When the cobalt oxide thin film is formed, a target of cobalt is sputtered in an atmosphere containing an inert gas and a gas having molecular oxygen by supplying an input power to the target and applying an input voltage between the target and the substrate from a DC supply. We have found that an abrupt change of the input voltage occurs at a transition point of input power and that an improved cobalt oxide thin film is obtained by controlling the input power during sputtering to be not lower than the transition point.

More particularly, in the formation of a cobalt oxide film represented by $CoO_x$ on a substrate surface by sputtering, especially magnetron sputtering, a mixture of inert gas and a gas having molecular oxygen in a varying ratio is passed through the vacuum chamber. The input voltage is plotted relative to the input power to the cobalt target. Then above a certain input power, there appears a transition point at which the input voltage abruptly rises. This transition point varies depending on the ratio of inert gas to oxygen, pressure and other sputtering conditions. Independent of sputtering conditions, films formed with an input power which is equal to or higher than the transition point are oxidized to an adequate degree. Therefore, a bond exhibiting improved wet heat resistance is achieved without post treatment or heat treatment. A similar transition point is observed when a sputtering apparatus designed to deposit films in a different manner is used. A cobalt oxide film formed with an input power at or above the transition point is improved in resistance to wet heat deterioration after rubber is vulcanized thereto.

In a first aspect, the present invention provides a method for forming a thin film of a metal compound on a substrate, comprising the step of sputtering a target of a corresponding metal or metal compound in the presence of an inert gas and a reactive gas capable of reacting with atoms sputtered from the target to form the metal compound. The method further includes the steps of previously determining from the relationship of an input power supplied from a DC supply to the target to an input voltage between the target and the substrate during provisional sputtering at a predetermined vacuum and in a predetermined ratio of the reactive gas to the inert gas, a transition point of input power at which an abrupt change of the input voltage occurs, and controlling the input power during sputtering using the transition point as a reference, thereby controlling the composition or physical properties of the metal compound thin film. In one form, the input power is below the transition point. In another form, the input power is at or above the transition point.

In preferred embodiments wherein the metal compound is a metal oxide $MeO_x$, metal nitride $MeN_x$ or metal carbide $MeC_x$ wherein Me is a metal atom, the input power is controlled to be below or at least the transition point, thereby controlling the value of x.

In a second aspect, the invention provides a method for preparing a rubber composite material comprising the steps of forming a thin film of cobalt oxide on a surface of a substrate, forming a rubber composition on the thin film, and vulcanizing the rubber composition. The step of forming a thin film of cobalt oxide includes the steps of sputtering a target of cobalt in the presence of an inert gas and a gas having molecular oxygen with an input power which is at least the transition point at which an input voltage between the target and the substrate abruptly rises when an input power is supplied to the target from a DC supply.

BRIEF DESCRIPTION OF THE DRAWINGS

The only figure.

DETAILED DESCRIPTION OF THE INVENTION

Figure 1:
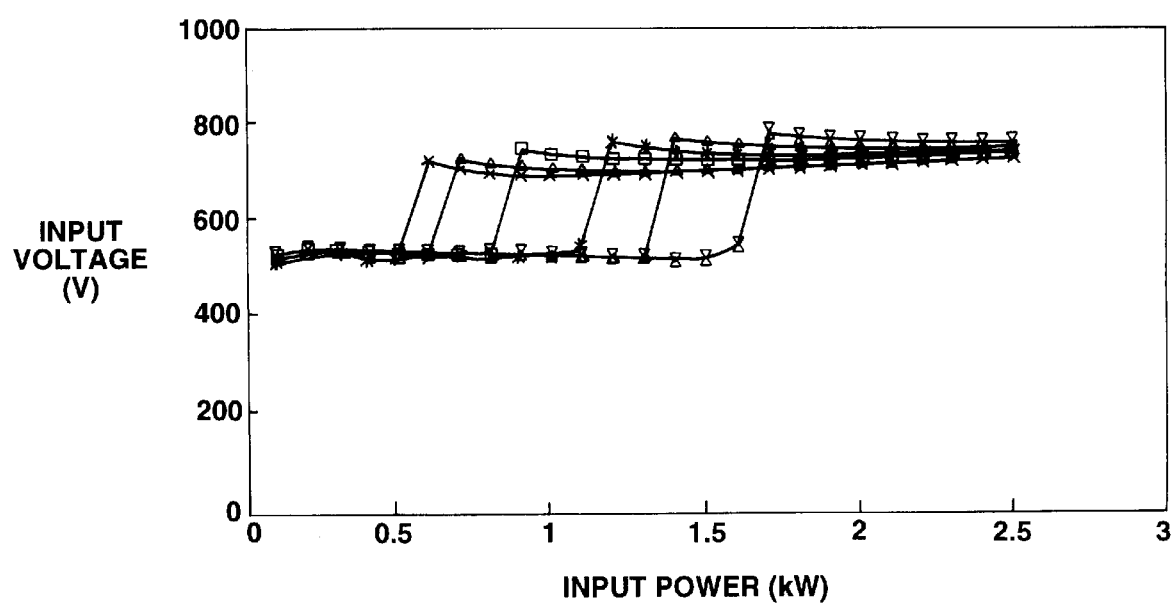
FIG. 1 is a graph showing an input voltage versus an input power in a magnetron sputtering process.

In the first aspect of the invention, a thin film of a metal compound is formed on a surface of a substrate by sputtering a target of a corresponding metal or metal compound in an atmosphere containing an inert gas and a reactive gas capable of reacting with atoms sputtered from the target to form the metal compound. Sputtering is preferably carried out by a DC sputtering technique using any well-known apparatus. From a practical standpoint, a magnetron sputtering technique is desirable because of a high deposition rate.

In provisional sputtering, an input power is supplied to the target and an input voltage applied between the target and the substrate from a DC supply while the atmosphere is adjusted to a predetermined vacuum and a predetermined ratio of reactive gas to inert gas. From the relationship of the input power to the input voltage, a transition point of input power at which an abrupt change of input voltage occurs is previously determined. Sputtering is then carried out while the input power is controlled using the transition point as a reference.

The method of the invention is applicable to the formation of thin films of metal compounds which include metal oxides represented by $MeO_x$ wherein Me is a metal such as Al, Co, Cr, Cu, Fe, In, Mg, Sn, Ti, and Zn and x is a positive number in the range of $0<x\leq10$, preferably $0<x\leq5$;

metal nitrides represented by $MeN_x$ wherein Me is a metal such as Al, Ca, Cr, Cu, Fe, Mg, and Ti and x is a positive number in the range of $0<x\leq20$, preferably $0<x\leq10$; and metal carbides represented by $MeC_x$ wherein Me is a metal such as Al, Ca, Fe, Mn, and Ti and x is a positive number in the range of $0<x\leq10$, preferably $0<x\leq5$. In all cases, the range of x varies with the type of metal.

Where an oxide film is to be formed, a mixture of an oxidizing gas and a sputtering gas is used for reaction during film deposition. The oxidizing gas used herein may be a gas having an oxygen atom such as oxygen, ozone, air, and steam while the type of oxidizing gas is not critical. Where a nitride film is to be formed, there may be used a gas having a nitrogen atom such as nitrogen, ammonia, and nitrogen oxides while the type of nitriding gas is not critical. Where a carbide film is to be formed, there may be used a gas having a carbon atom, for example, hydrocarbon gases such as methane and ethane while the type of carbonizing gas is not critical. The inert gas used for sputtering may be helium, argon or the like although most inexpensive argon is preferred for commercial use.

In general, the depositing film can be controlled in degree of oxidation or nitrogenation by adjusting a mix ratio of inert gas to reactive gas. However, the degree of oxidation or nitrogenation accomplished thereby varies with the size and ultimate vacuum of the vacuum chamber, the size of the target, and a particular sputtering technique.

According to the invention, an input power supplied from a DC supply to the target and an input voltage between the target and the substrate are monitored while varying the ratio of reactive gas to inert gas in a predetermined vacuum. Then the input voltage is plotted relative to the input power in a graph as shown in FIG. 1. Along the input voltage-input power curve, the input voltage abruptly changes or rises at a certain input power, which is designated a transition point. That is, the transitions point is determined from the input voltage-input power relationship.

Sputtering is carried out under film deposition conditions determined from a shift of input power from the transition point, that is, under deposition conditions where the input power is less than or at least the transition point. This controls the degree of oxidation, nitrogenation or carbonization, that is, the value of x, resulting in a thin film having desired composition or physical properties.

In the case of $MeO_x$ such as $CoO_x$, the value of x resulting from an input power-approximate to the transition point varies with the type of Me. Where Me is a metal which is likely to form a divalent ion, for example, the value of x is 1 or greater with an input power less than the transition point and x is less than 1 with an input power at or greater than the transition point. With an input power above the transition point, there is a tendency that the value of x gradually decreases as the input power increases. Where Me is a monovalent metal, the value of x resulting from an input power approximate to the transition point will be 0.5. For a thin film of $CoO_x$ to be formed, for example, by carrying out sputtering with an input power equal to or above the transition point, the degree of oxidation can be controlled low. This enables formation of a thin film which is ready to provide adequately controlled reaction with sulfur in rubber when a rubber composite material is subsequently formed.

There is a likelihood that the composition or physical properties of a thin film be inconsistent when the input power is approximate to the transition point. It is then recommended to carry out sputtering with an input power which is higher than the transition point by at least 30 W, more preferably at least 50 W, most preferably at least 100 W.

In the case of $MeN_x$, the value of resulting from an input power approximate to the transition point varies with the type of Me as in the metal oxide case. Where Me is a metal which is likely to form a trivalent ion, for example, the value of x is 1 or greater with an input power lower than the transition point and x is less than 1 with an input power at or greater than the transition point. With an input power above the transition point, there is a tendency that the value of x gradually decreases as the input power increases. With respect to the value of x resulting from an input power approximate to the transition point, a monovalent metal will give a value of 0.33 for x and a divalent metal will give a value of 0.67. For a thin film of $TiN_x$ to be formed, for example, by carrying out sputtering with an input power equal to or above the transition point, the degree of nitrogenation is reduced and the color is changed from golden to metallic.

In the case of $MeC_x$, the value of x resulting from an input power approximate to the transition point varies with the type of Me as in the preceding cases. The value of x ranges from about 0.33 to about 2 with an input power approximate to the transition point. There is a tendency that the value of x exceeds this range with an input power lower than the transition point, but is below this range with an input power higher than the transition point. For a thin film of $TiC_x$ to be formed, for example, by carrying out sputtering with an input power equal to or above the transition point, the degree of carbonization can be reduced.

In the practice of the invention, other sputtering conditions are well known in the art. For example, the vacuum is usually 1 mTorr to 1 Torr. The input power which varies with the size of a target is usually in the range of 100 to 400 W for a conventional target of 4 inches in diameter.

According to the method of the invention, a thin film of a metal compound having a controlled composition (including a degree of oxidation, nitrogenation or carbonization) and physical properties can be readily and effectively formed in a reproducible manner by sputtering.

In the second aspect of the invention, a rubber composite material is prepared by forming a thin film of cobalt oxide on a surface of a substrate, forming a rubber coating on the thin film, and vulcanizing the rubber coating. The method of the first aspect is utilized to form the cobalt thin film.

The type of substrate is not critical and any of metal, ceramic and plastic substrates is applicable. The metal substrates include those of steel, stainless steel, titanium alloys, aluminum, aluminum alloys, copper, copper alloys, zinc, zinc alloys, and amorphous alloys though not limited thereto. As the ceramic or plastic substrate, a suitable one may be selected from a variety of such substrates in accordance with a particular purpose. The shape and size of the substrate may be selected in accordance with a particular purpose.

Where a film of cobalt oxide ($CoO_x$) is formed on a substrate surface, the substrate is pretreated, preferably by cleaning. To this end, wet cleaning techniques such as solvent cleaning, ultrasonic cleaning, acid pickling and alkali cleaning are useful as are dry cleaning techniques such as corona discharge treatment, atmospheric plasma cleaning in an inert gas atmosphere, plasma cleaning in vacuum, and back-sputtering. These pretreatments are desirable to enhance the adhesion of a $CoO_x$ film to the substrate.

In forming a $CoO_x$ film on the substrate, DC magnetron sputtering and opposed target sputtering techniques are suitable particularly for controlling the composition of the $CoO_x$ film.

Where a cobalt oxide film is to be formed, a mixture of an oxidizing gas and a sputtering gas is used for reaction during film deposition. A reactive sputtering technique is generally used. The oxidizing gas used herein may be a gas having an oxygen atom such as oxygen, ozone, air, and steam while the type of oxidizing gas is not critical. The inert gas used for sputtering may be helium, argon or the like although most inexpensive argon is preferred for commercial use. In general, the cobalt oxide film can be controlled in degree of oxidation by adjusting a mix ratio of inert gas to reactive gas. However, the degree of oxidation accomplished thereby varies with the size and ultimate vacuum of the vacuum chamber, the size of the cobalt target, and a particular sputtering technique.

According to the invention, input power supplied to the target and input voltage applied between the target and the substrate from a DC supply are monitored while varying the ratio of reactive gas to inert gas in a predetermined vacuum. Then the input voltage is plotted relative to the input DC power in a graph as shown in FIG. 1. Along the input voltage-input power curve, the input voltage abruptly changes or rises at a certain input power, which is designated a transition point. That is, the transition point is determined from the input voltage-input power relationship.

Sputtering is carried out with an input power which is not lower than the transition point. Since there is a likelihood that the adhesion of a thin film be inconsistent when the input power is approximate to the transition point, sputtering is preferably carried out with an input power which is higher than the transition point by at least 30 W, more preferably at least 50 W, most preferably at least 100 W. There is then obtained a cobalt oxide thin film having a high degree of oxidation and improved adhesion.

Other sputtering conditions are well known in the art. For example, the vacuum is usually 1 mTorr to 1 Torr. The preferred atmosphere consists of an inert gas and a gas having molecular oxygen in a volume ratio of inert gas/$O_2$ of from 100/0.1 to 100/100.

The thickness of the cobalt oxide film may be selected in accordance with a particular purpose although it is generally 10 Å to 100 µm, especially 50 Å to 1 µm from the standpoint of thin film productivity.

The rubber composition used herein is based on a rubber component which may be selected from natural rubber (NR) and a synthetic rubber having a carbon-to-carbon double bond in its structural formula, alone or a blend of two or more. Exemplary synthetic rubbers include homopolymers of conjugated diene compounds such as isoprene, butadiene and chloroprene, for example, polyisoprene rubber (IR), polybutadiene rubber (BR), and polychloroprene rubber; copolymers of the aforementioned conjugated diene compounds with vinyl compounds such as styrene, acrylonitrile, vinylpyridine, acrylic acid, methacrylic acid, alkyl acrylates, and alkyl methacrylates, for example, styrene-butadiene copolymer rubber (SBR), vinylpyridine-butadiene-styrene copolymer rubber, acrylonitrile-butadiene copolymer rubber, acrylic acid-butadiene copolymer rubber, methacrylic acid-butadiene copolymer rubber, methyl acrylate-butadiene copolymer rubber, and methyl methacrylate-butadiene copolymer rubber; copolymers of olefins such as ethylene, propylene, and isobutylene with diene compounds, for example, isobutylene-isoprene copolymer rubber (IIR); copolymers of olefins with unconjugated dienes (generally known as EPDM), for example, ethylene-propylene-cyclopentadiene terpolymers, ethylene-propylene-5-ethylidene-2-norbornene terpolymers, and ethylene-propylene-1,4-hexadiene terpolymers; polyalkenamers resulting from ring-opening polymerization of cycloolefins, for example, polypentenamer; rubbers resulting from ring-opening polymerization of oxirane rings, for example, sulfur-vulcanizable polyepichlorohydrin rubber; and polypropylene oxide rubber. Also included are halogenated products of the foregoing various rubbers, for example, chlorinated isobutylene-isoprene copolymer rubbers (Cl-IIR) and brominated isobutylene-isoprene copolymer rubbers (Br-IIR). Ring-opened polymers of norbornene are also useful. Additionally, useful blend rubbers are blends of the foregoing rubbers with saturated elastomers such as epichlorohydrin rubber, polypropylene oxide rubber, and chlorosulfonated polyethylene.

The rubber composition used herein may further contain a crosslinking agent such as sulfur and organic sulfur compounds, preferably in an amount of 0.01 to 10 parts, more preferably 0.1 to 6 parts by weight per 100 parts by weight of the rubber component. The rubber composition may also contain a vulcanization promoter, preferably in an amount of 0.01 to 10 parts, more preferably 0.1 to 5 parts by weight per 100 parts by weight of the rubber component. The type of vulcanization promoter is not critical although the vulcanizing time can be shortened using N-cyclohexyl-2-benzothiazole sulfenamide (CZ).

Further, in the rubber composition used herein, there are preferably blended paraffinic, naphthenic and aromatic process oils, ethylene-α-olefin co-oligomers, mineral oils such as paraffin wax and liquid paraffin, and vegetable oils such as castor oil, cottonseed oil, linseed oil, colza oil, soybean oil, palm oil, coconut oil, and peanut oil. The addition of such oil is effective for improving wet adhesion of rubber to the cobalt oxide thin film when the CZ vulcanization promoter is used. The amount of oil blended is preferably about 3 to 50 parts, especially about 4 to 10 parts by weight per 100 parts by weight of the rubber component. Less amounts of oil would be less effective for improving wet heat adhesion of rubber whereas larger amounts of oil would markedly alter the resiliency of rubber itself, especially $\tan\delta$ which is important for damping vibration when the rubber is used as a shock absorber.

A suitable rubber composition may be prepared in accordance with a particular purpose and application by further adding a filler such as carbon black, silica, calcium carbonate, calcium sulfate, clay and mica and a vulcanization co-promoter such as zinc white and stearic acid to the rubber component. In the practice of the invention, it is unnecessary to blend an organic cobalt salt as an agent for promoting vulcanization and adhesion between partially oxidized cobalt and rubber.

The rubber composition is joined to the $CoO_x$ thin film on the substrate by applying the rubber composition to the thin film and heating the rubber coating under pressure for accomplishing vulcanization and adhesion. The useful vulcanization techniques include sulfur vulcanization and organic sulfur vulcanization using organic sulfur compounds such as dithiomorpholine and thiuram accelerators. Vulcanization may be carried out in a conventional manner. Sulfur vulcanization is preferred among others. The amount of sulfur (or sulfur in organic sulfur compound) blended is preferably 0.5 to 7 parts, especially 1 to 6 parts by weight per 100 parts by weight of the rubber component.

According to the present method, when a rubber composition having sulfur blended in an amount as large as about 5 or 6 parts was vulcanized to the $CoO_x$ thin film for a long time, no failure occurred within the $CoO_x$ thin film in a peel test in a cold atmosphere at about –60° C., for example. This indicates that the rubber is firmly bonded to the substrate. Therefore, the present method is effectively applicable to the manufacture of various rubber products and parts used in applications where a high bond strength between rubber and a metal or another substrate is requisite, for example, rubber composite materials using metal fibers as a reinforcement such as tires, power transmission belts, conveyor belts, and hoses as well as vibration damping rubber, shock absorbers, rubber track, rubber screens, and rubber rolls.

The method of the second aspect can easily control the degree of oxidation of a cobalt oxide thin film on a substrate so that a rubber layer can be firmly bonded to the substrate, thereby significantly improving the resistance to wet heat deterioration of the rubber composite material. As compared with the conventional method, the inventive method can form a $CoO_x$ thin film having a controlled degree of oxidation in a single step independent of the type of sputtering apparatus.

EXAMPLE

Examples of the present invention are given below by way of illustration and not by way of limitation.

Reference Example

A substrate in the form of a holder of stainless steel (SUS) and a target of cobalt were placed in a DC magnetron sputtering apparatus. A mixture of argon as a sputtering gas and oxygen as an oxidizing gas in a varying ratio was fed into the vacuum chamber. From a DC supply, an input power was supplied to the target and an input voltage applied between the target and the substrate. Curves of input voltage versus input power were depicted for various sets of conditions. Argon was passed at a flow rate of 18 ml/min. and oxygen to be mixed therewith was fed at a rate of 5 to 14 ml/min. The gas pressure was 3.66 mTorr. The results are shown in the graph of FIG. 1.

It was observed in FIG. 1 that the input voltage abruptly rose at a certain input power for each set of conditions, that is, the input voltage versus input power curve had a transition point.

Example 1

Using the same magnetron sputtering apparatus as used in Reference Example, $CoO_x$ films of 2,000 Å thick were formed on a glass substrate to different degrees of oxidation. The sputtering conditions included 18 ml/min. of argon as a sputtering gas, 6 ml/min. of oxygen as an oxidizing gas, and a gas pressure of 5 mTorr. Film deposition was carried out for 30 seconds while varying the input power to the target.

The cobalt oxide films were measured for volume resistivity using a volume resistivity meter manufactured by Mitsubishi Uka K.K. The value of x in $CoO_x$ was calculated from the ratio of Co to O in the film as measured by an instrument of electron spectroscopy for chemical analysis (ESCA) manufactured by Shimazu Mfg. K.K.

TABLE 1

| Input power (W) | Input voltage (V) | Input current (A) | Volume resistivity (Ω-cm) | x |
|---|---|---|---|---|
| 200 | 541 | 0.37 | $2.5 \times 10^{-1}$ | 1.2 |
| 400 | 530 | 0.75 | $5.8 \times 10^{-1}$ | 1.2 |
| 600 | 520 | 1.13 | $1.3 \times 10^{3}$ | 1.0 |
| 700 | 728 | 0.96 | $1.9 \times 10^{0}$ | 0.7 |
| 750 | 720 | 1.04 | $5.4 \times 10^{-1}$ | 0.7 |
| 800 | 714 | 1.12 | $6.8 \times 10^{-2}$ | 0.6 |
| 1000 | 703 | 1.42 | $3.6 \times 10^{-4}$ | 0.4 |
| 1500 | 709 | 2.12 | $5.4 \times 10^{-5}$ | 0.2 |
| 2000 | 722 | 2.77 | $1.8 \times 10^{-5}$ | 0.1 |
| 2500 | 735 | 3.40 | $1.4 \times 10^{-5}$ | 0.1 |

It is evident from the data of Table 1 that an abrupt change of resistance occurs at a transition point of about 700 W. Once the transition point is known, the resistance of a thin film can be controlled in terms of a shift of input power from the transition point.

Example 2

Using the same magnetron sputtering apparatus as used in Reference Example, $TiN_x$ films of 2,000 Å thick were formed on a glass substrate to different degrees of nitrogenation. The sputtering conditions included 18 ml/min. of argon as a sputtering gas, 3 ml/min. of nitrogen as a nitriding gas, and a gas pressure of 5 mTorr. Film deposition was carried out for 5 minutes while varying the input power to the target. A curve of an input power to the target versus an input voltage was depicted, and a transition point appeared at an input power of 400 W.

The thin films were visually observed for color, finding that a substantial change of color occurred at the transition point on the power-voltage curve. With input powers above the transition point, the films were blackish brown and became more black as the input power increased. With input powers below the transition point, the films were golden and became more yellow as the input power decreased. This suggests that the film can be controlled in color using the transition point as a reference.

Example 3

An aluminum specimen of 10×75×0.5 mm was used as a substrate. The substrate on its surface was cleaned with acetone and subjected to argon plasma treatment at a radio frequency of 13.56 MHz and 100 W for 5 minutes. By magnetron sputtering, $CoO_x$ films of 500 Å thick were formed on the substrate to different degrees of oxidation. The sputtering conditions included 18 ml/min. of argon as a sputtering gas, 6 ml/min. of oxygen as an oxidizing gas, and a gas pressure of 5 mTorr. Film deposition was carried out for 30 seconds while varying the input power to the target.

Next, an unvulcanized rubber composition as shown in Table 2 was applied to the metallized substrate and vulcanized at 145° C. for 40 minutes (normal vulcanizing conditions) or for 400 minutes (heat resistance test) to bond the rubber to the substrate. A peel test was carried out. The sample vulcanized for 400 minutes was cooled in liquefied nitrogen and instantaneously subject to a peel test to observe a failure. The sample vulcanized for 40 minutes was subject to a peel test at room temperature. Also the sample vulcanized for 40 minutes was allowed to stand for 7 days in a constant temperature, constant humidity tank at 80° C. and RH 98% and then subjected to a peel test in a cold tank at −60° C. The results are shown in

TABLE 2

| Components | Parts by weight |
|---|---|
| Natural rubber | 75 |
| Synthetic polyisoprene | 25 |
| Carbon black | 60 |
| Zinc white | 7.5 |
| Anti-oxidant* | 2 |
| Vulcanization promoter** | 1 |
| Sulfur | 5 |
| Mineral oil | 2 |

*N-phenyl-N'-isopropyl-p-phenylenediamine
**N-oxydiethylene-2-benzothiazole sulfide

TABLE 3

| | | | Rupture surface | | | |
|---|---|---|---|---|---|---|
| Input power (W) | Input voltage (V) | Input current (A) | Normal test 40' vulcanize /RT peel | Heat test 400' vulcanize /cold peel | Wet heat test 40' vulcanize /cold peel | |
| 0 | 0 | 0 | M/R-100 | M/R-100 | M/R-100 | Comparison |
| 200 | 541 | 0.37 | F/R-100 | F/R-100 | F/R-100 | Comparison |
| 400 | 530 | 0.75 | F/R-100 | F/R-100 | F/R-100 | Comparison |
| 600 | 520 | 1.13 | F/R-100 | F/R-100 | F/R-100 | Comparison |
| 700 | 726 | 0.96 | R-100 | F/R-100 | F/R-100 | Invention |
| 750 | 720 | 1.04 | R-100 | R-100 | R-100 | Invention |
| 800 | 714 | 1.12 | R-100 | R-100 | R-100 | Invention |
| 1000 | 703 | 1.42 | R-100 | R-100 | R-100 | Invention |
| 1500 | 709 | 2.12 | R-100 | R-100 | R-100 | Invention |
| 2000 | 722 | 2.77 | R-100 | R-100 | R-100 | Invention |
| 2500 | 735 | 3.40 | R-100 | R-100 | R-100 | Invention |

It is evident from Table 3 that an input power below the transition point (700 W) results in a weak bond at low temperature whereas $CoO_x$ films deposited with input powers above the transition point, especially 750 W or higher always show a superior bond at room temperature, at low temperature (after the heat resistance test), and after wet heat deterioration.

Example 4

An aluminum specimen was pretreated as in Example 3. By magnetron sputtering, $CoO_x$ films of 500 Å thick were formed on the substrate to different degrees of oxidation. The sputtering conditions included 18 ml/min. of argon as a sputtering gas, 0.2, 1, 2, 3.2, 5 and 6 ml/min. of oxygen as an oxidizing gas (corresponding to 1, 5, 11, 15, 22, and 25% of argon+oxygen), and a gas pressure of 5 mTorr. Film deposition was carried out for 30 seconds with the input power to the target kept substantially constant.

Next, the unvulcanized rubber composition shown in Table 2 was applied to the metallized substrate and vulcanized as in Example 3. A peel test was carried out as in Example 3. For comparison purposes, the metallized substrate was heat treated at 200° C. for 10 minutes before a similar test was carried out. The results are shown in Table 4.

TABLE 4

| Oxygen concentration (%) | Input power (W) | Input voltage (V) | Input current (A) | Heat treatment | Rupture surface | | | |
|---|---|---|---|---|---|---|---|---|
| | | | | | Normal test 40' vulcanize /RT peel | Heat test 400' vulcanize /cold peel | Wet heat test 40' vulcanize /cold peel | |
| 1 | 864 | 720 | 1.2 | no | R-100 | F/R-100 | F/R-100 | Comparison |
| 5 | 923 | 710 | 1.3 | no | R-100 | F/R-100 | F/R-100 | Comparison |
| 11 | 923 | 710 | 1.3 | no | R-100 | F/R-100 | F/R-100 | Comparison |
| 15 | 1022 | 730 | 1.4 | no | R-100 | F/R-100 | F/R-100 | Comparison |
| 22 | 974 | 750 | 1.3 | no | R-100 | R-100 | R-100 | Invention |
| 25 | 1050 | 750 | 1.4 | no | R-100 | R-100 | R-100 | Invention |
| 1 | 864 | 720 | 1.2 | done | R-100 | R-100 | R-100 | Comparison |
| 5 | 923 | 710 | 1.3 | done | R-100 | R-100 | R-100 | Comparison |
| 11 | 923 | 710 | 1.3 | done | R-100 | R-100 | R-100 | Comparison |
| 15 | 1022 | 730 | 1.4 | done | R-100 | R-100 | R-100 | Comparison |
| 22 | 974 | 750 | 1.3 | done | R-100 | R-100 | R-100 | Invention |
| 25 | 1050 | 750 | 1.4 | done | R-100 | R-100 | R-100 | Invention |

Note that with an oxygen concentration of more than 20%, the input power was above the transition point at which the voltage between the target and the substrate abruptly rose.

It is understood from Table 4 that the method of JP-A 290342/1989 achieves a bond having satisfactory resistance to heat and wet heat through two steps of $CoO_x$ film formation and heat treatment whereas the inventive method achieves a satisfactorily durable bond through one step of film formation by controlling the flow rate of oxygen and the input power to the target.

Example 5

An aluminum specimen was pretreated as in Example 3.

Using a magnetron sputtering apparatus which was different from that used in Example 3 with respect to chamber dimensions, target size and shape, $CoO_x$ films of 500 Å thick were formed on the substrate to different degrees of oxidation. The sputtering conditions included 18 ml/min. of argon as a sputtering gas, 3 ml/min. of oxygen as an oxidizing gas, and a gas pressure of 5 mTorr. Film deposition was carried out for 30 seconds with the input power to the target kept substantially constant.

Next, the unvulcanized rubber composition shown in Table 2 was applied to the metallized substrate and vulcanized as in Example 3. A peel test was carried out as in Example 3. For comparison purposes, the metallized substrate was heat treated at 200° C. for 10 minutes before a similar test was carried out. The results are shown in Table 5.

TABLE 5

| Input power (W) | Input voltage (V) | Input current (A) | Rupture surface | | | |
|---|---|---|---|---|---|---|
| | | | Normal test 40' vulcanize /RT peel | Heat test 400' vulcanize /cold peel | Wet heat test 40' vulcanize /cold peel | |
| 0 | 0 | 0 | M/R-100 | M/R-100 | M/R-100 | Comparison |
| 100 | 354 | 0.28 | F/R-100 | F/R-100 | F/R-100 | Comparison |
| 200 | 356 | 0.56 | F/R-100 | F/R-100 | F/R-100 | Comparison |
| 300 | 347 | 0.86 | R-100 | F/R-100 | F/R-100 | Comparison |
| 400 | 440 | 0.91 | R-100 | R-100 | R-100 | Invention |
| 500 | 428 | 1.17 | R-100 | R-100 | R-100 | Invention |
| 600 | 425 | 1.41 | R-100 | R-100 | R-100 | Invention |
| 800 | 430 | 1.86 | R-100 | R-100 | R-100 | Invention |
| 1000 | 437 | 2.29 | R-100 | R-100 | R-100 | Invention |
| 1200 | 446 | 2.69 | R-100 | R-100 | R-100 | Invention |

It is evident from Table 5 that input powers of less than 300 W, that is, below the transition point result in a weak bond at low temperature whereas $CoO_x$ films deposited with input powers of above the transition point, especially 400 W or higher always show a superior bond at room temperature, at low temperature (after the heat resistance test), and after wet heat deterioration.

Japanese Patent Application Nos. 123164/1995 and 123166/1995 are incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A method for preparing a rubber composite material comprising the steps of:
   forming a thin film of a cobalt oxide on a substrate,
   forming a rubber composition on the thin film, and
   vulcanizing the rubber composition,
   wherein said step of forming a thin film of cobalt oxide comprises the steps of:
      determining from a relationship of an input power supplied from a DC supply to a target to an input voltage between said target and said substrate, during a step of provisional sputtering at a vacuum and in a ratio of the oxygen-bearing gas to the inert gas, a transition point of input power at which an abrupt change of the input voltage occurs;
   sputtering said target of a cobalt in the presence of an inert gas and a gas having molecular oxygen; and controlling the input power during sputtering to be at least the transition point, thereby controlling the value of x in $CoO_x$, wherein the sputtering carried out after the determination of the transition point is carried out with an input power which is higher than the transition point by at least 50 W, thereby obtaining, a cobalt oxide represented by $CoO_x$ wherein x 0.1 to 0.7, and said rubber composition is formed on said thin film of cobalt oxide without heat treating said thin film of cobalt oxide on the substrate.

2. The method of claim 1 wherein the sputtering is carried out with an input power which is higher than the transition point by at least 100 W.

* * * * *